United States Patent [19]

Johnson

[11] Patent Number: 5,150,058
[45] Date of Patent: Sep. 22, 1992

[54] E-FIELD DETECTOR AND ANNUNCIATOR

[76] Inventor: Michael J. Johnson, 12809 N. 2nd St., Phoenix, Ariz. 85022

[21] Appl. No.: 352,048

[22] Filed: May 15, 1989

[51] Int. Cl.$^5$ ............................................. G01R 31/08
[52] U.S. Cl. ...................................... 324/519; 324/530
[58] Field of Search ............. 324/530, 527, 528, 519, 324/515, 522, 690, 414, 403; 340/642, 641, 652

[56] References Cited

U.S. PATENT DOCUMENTS

| | | | |
|---|---|---|---|
| 1,745,419 | 2/1930 | Henneberger | 324/530 X |
| 2,461,962 | 2/1949 | Carlson | 340/642 X |
| 3,096,478 | 7/1963 | Brown | 324/514 |
| 3,229,199 | 1/1966 | Mildner | 324/515 |
| 3,711,767 | 1/1973 | Campbell, Jr. et al. | 324/530 X |
| 3,748,577 | 7/1973 | Jones, Jr. | 324/61 R |
| 3,781,666 | 12/1973 | Dornberger | 324/518 |
| 4,052,665 | 10/1977 | Gruenwald | 324/530 |
| 4,164,703 | 8/1979 | Boggs et al. | 324/530 X |
| 4,241,304 | 12/1980 | Clinton | 324/516 |
| 4,259,634 | 3/1981 | Okamoto et al. | 324/74 |
| 4,487,057 | 12/1984 | Lutz | 73/40.5 |
| 4,823,078 | 4/1989 | Mohebban | 324/133 |

FOREIGN PATENT DOCUMENTS

| | | |
|---|---|---|
| 0172634 | 7/1985 | European Pat. Off. . |
| 20078 | 2/1978 | Japan . |
| 2151360 | 7/1985 | United Kingdom ................ 324/530 |

Primary Examiner—Kenneth A. Wieder
Attorney, Agent, or Firm—Joseph Failla

[57] ABSTRACT

The voltage potential and E-Field occurring at the site of a circuit discontinuity is detected by capacitively coupling and actuating an annunciator responsive to an above threshold energy level.

24 Claims, 3 Drawing Sheets

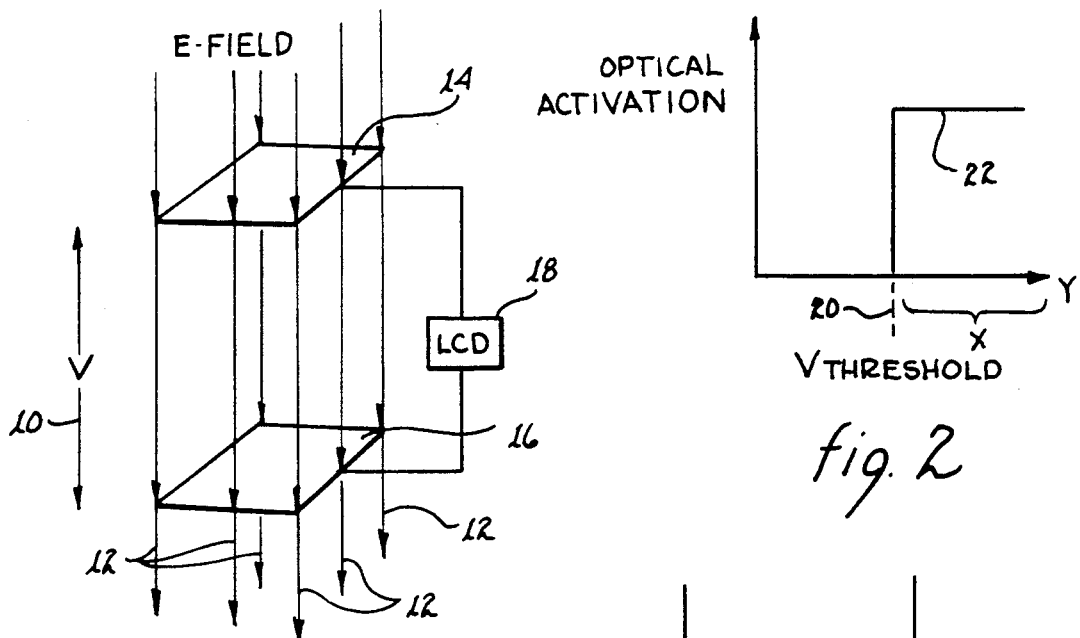
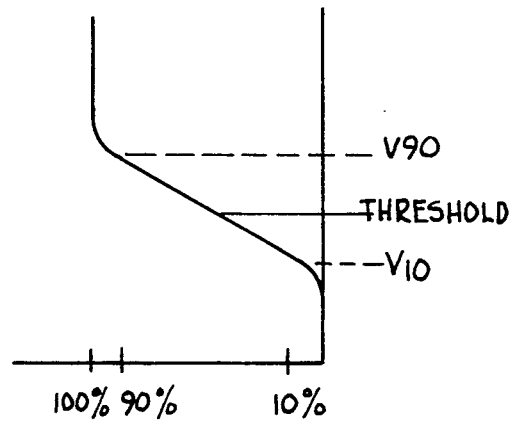
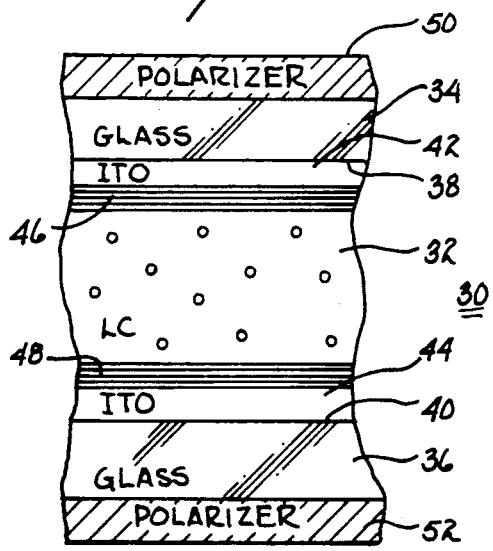
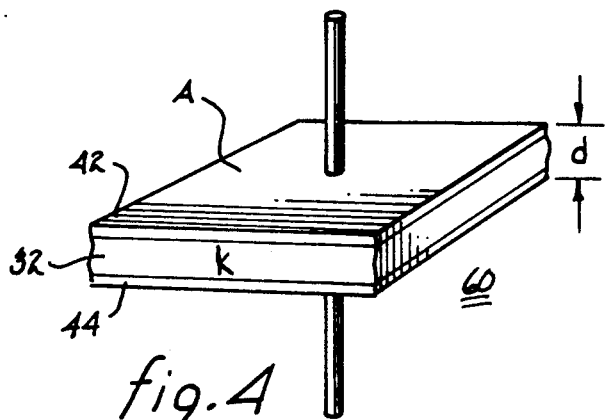
$$C = \frac{keA}{d}$$
fig. 5

$K_{os} \approx 4K_o$, TYPICALLY

E-FIELD DETECTOR AND ANNUNCIATOR

BACKGROUND OF THE INVENTION

1. Field of the Invention

The present invention relates to detection circuits and, more particularly, to a circuit for detecting and annunciating the presence of an electrical field.

2. Description of the Prior Art

Capacitive coupling or the use of capacitive transducers to sense the presence of a voltage potential or electric field generates a signal responsive to a change in charge across the capacitive device. Such signal is acted upon to provide an indication or produce an output signal reflective of the state of the electrical element being monitored. Circuitry of this type contemplates the use of active components and requires a source of electrical power. Moreover, such circuits are generally relatively expensive and functionally limited to particular applications.

SUMMARY OF THE INVENTION

A discontinuity in a series circuit establishes a voltage potential and attendant electric field at the site of a discontinuity. A capacitive pickup located proximate the discontinuity will sense the electric field (E-Field) and provide a corresponding change in energy level. The energy level is applied across the terminals of a liquid crystal display (LCD). The LCD has a threshold characteristic which is used to discriminate between spurious energy levels sensed and an E-Field of interest. Moreover, the extremely high impedance characteristics of an LCD permits operation in response to a very low level energy input and little, if any, interference with the signal being measured will occur. Since the LCD can be energized by the E-Field sensed, a power supply is unnecessary to annunciate the presence of a condition sought to be sensed.

It is therefore a primary object of the present invention to provide apparatus for capacitively sensing the presence of an E-Field, generating a responsive signal and using the signal generated to energize an annunciator.

Another object of the present invention is to provide apparatus for detecting and annunciating a circuit discontinuity.

Yet another object of the present invention is to provide apparatus for annunciating the presence of an E-Field having an energy level above a predetermined threshold.

Still another object of the present invention is to provide a self contained unpowered detector for detecting and annunciating a circuit discontinuity.

A further object of the present invention is to detect and annunciate a signal without interfering with the signal detected.

A yet further object of the present invention is to provide a low cost easy to use circuit discontinuity detector and annunciator.

A still further object of the present invention is to provide a method for detecting an E-Field and annunciating the presence of an E-Field above a predetermined threshold.

A still further object of the present invention is to provide a method for capacitively sensing the presence of an E-Field above a predetermined threshold and for using the capacitive charge to energize an annunciator.

These and other objects of the present invention will become apparent to those skilled in the art as the description thereof proceeds.

BRIEF DESCRIPTION OF THE DRAWINGS

The present invention will be described with greater clarity and specificity with reference to the following drawings, in which:

FIG. 1 represents an E-Field and the relationship of the present invention thereto;

FIG. 2 is a graph illustrating the threshold capability of preferred annunciator;

FIG. 2A illustrates a typical response characteristic of an LCD;

FIG. 3 is a partial cross sectional view of an LCD usable with the present invention;

FIG. 4 represents an LCD as a classic plate capacitor;

FIG. 5 represents an LCD as a capacitor and recites the formula for determining the capacitance;

DESCRIPTION OF THE PREFERRED EMBODIMENT

Figure 6:
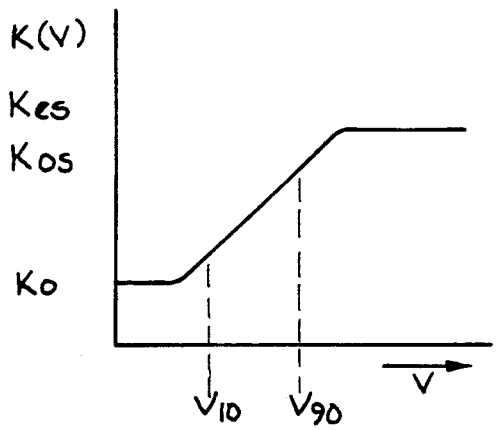
FIG. 6 is a graph similar to that shown in FIG. 2A but incorporating a legend representative of the dielectric constant.

To find a bad bulb in a string of series connected ornamental light bulbs is invariably a frustrating task. Necessarily, the bulb is open circuited and none of the bulbs will be lighted. Were the bulb short circuited, all lights but it would be lighted. Inevitably, an attempt is made to identify the defective bulb. Most often, the initial attempt is that of replacing the bulbs one by one until the string lights up. For a long string, this task is burdensome. Moreover, the process of removing and replacing bulbs can result in producing further defects. The step of replacing each of the bulbs can be augmented by a further step of installing each removed bulb in a test socket to verify the condition of the bulb under test. This step further burdens the task.

To reduce the number of lights that must be individually tested, an ohm meter can be employed to verify continuity in each half. By continuing to test for continuity the half of each previously tested discontinuous half, the defective light will ultimately be located. This procedure is relatively simple and not too time consuming. However, access to the circuit must be either by forcing the test probe into the socket with a bulb in place or by piercing the insulation attendant the wire. Either procedure may create a further fault. All of the above procedures are relatively inexpensive.

Using substantially more sophisticated and expensive equipment, a signal can be injected at one end of the string of lights. A reflected signal will emanate from the discontinuity of the conductor and the return signal can be sensed. By measuring the time interval between injection and return of the signal, the distance to the fault or discontinuity can be determined as the rate of travel of a signal is known. While this procedure will accurately locate the discontinuity, the equipment employed is very expensive, requires a certain sophistication for proper use and requires a separate power source. It is not a practical method for checking most ornamental strings of lights or other relatively low cost circuits. Moreover, where a source of power, whether stationery or portable, is not available, the apparatus is of no use.

Referring to FIG. 1, there is shown a voltage potential represented by arrow 10 which creates an E-Field represented by a plurality of parallel arrows 12. A pair of capacitive electrodes 14,16 are disposed in the E-Field. These electrodes pick up energy from the E-Field by capacitive coupling. An annunciator 18, which, in the preferred embodiment of the present invention, is a liquid crystal display (LCD) or equivalent electro-optical device. The energy resulting from the capacitive coupling is distributed between the pair of electrodes and the annunciator as a function of Ohm's Law which results in application of a voltage across annunciator 18.

If the energy of the E-Field is of sufficient magnitude, the voltage across annunciator 18 will be in excess of threshold voltage 20 depicted in FIG. 2. That is, a voltage above threshold 20 will be sufficient to energize or activate the optical element of annunciator 18, as depicted by line 22. Accordingly, the presence of a sufficiently strong E-Field may be visually represented at annunciator 18. Should the energy level be too low, the visual display would remain in an unenergized state and, as such, reflect the state of the E-Field at the site of the test.

In the event an E-Field of a specified level is of specific interest, modification of the simple circuit illustrated in FIG. 1 will provide a spectrum of E-Field energy levels necessary to actuate the annunciator. To accommodate various energy levels or threshold settings, a number of parameters of the circuit can be manipulated. In example, the geometry of electrodes 14,16 can be configured to result in different ratios of energy distribution. Such configuration can be adapted to provide a different threshold signal to the annunciator. Furthermore, the annunciator itself can be selected from a range of available electro-optical characteristics of the display materials. In particular, the dielectric constants and the optical activation thresholds may be selected for a liquid crystal display, if such be used. It is therefore evident that several degrees of freedom exist with which one can optimize the circuit for any given application or range of applications. More specifically, larger sized electrodes will provide a greater energy to drive the annunciator and, conversely, the annunciator can be tailored to require a lesser voltage potential to provide an optically displayed signal. It is to be appreciated that a power source may be incorporated to energize the annunciator; in which case, the signal generated can be used as a trigger to interconnect the source of power with the annunciator.

In the preferred embodiment, liquid crystal technology is used to implement the high input impedance of such a display device since the signal sensed is essentially unaffected. Alternative display technologies, such as PLZT, could be used. Unfortunately, presently known alternatives do not have the benefit of the low costs attendant the presently available liquid crystal displays.

Referring in particular to FIG. 3, a liquid crystal 30 will be described with respect to its adaptability and utility for use with the present invention. Typically, liquid crystal material 32 is sandwiched between opposed plates of glass 34,36; it is to be understood that material equivalent thereto could also be used. On the inside surfaces 38,40 of glass plates 34,36, respectively, transparent electrodes 42,44 are deposited. These electrodes may be a thin film of tin oxide, indium oxide or of indium tin oxide, for example. Alignment layers 46,48 are built upon the electrodes; they are typically made of a polymer such as polymid, which is mechanically buffed or drawn to form an ensemble orientation of the constituent polymer molecules. Polarizers 50,52 are placed on the outside surfaces of glass plates 34,36, respectively.

Glass plates 34,36 provide a structural foundation for the liquid crystal display. Transparent electrodes 42,44 provide a means for applying a voltage and excitation E-Field across liquid crystal material 32. Alignment layers 46,48 provide a means for establishing the orientation of the liquid crystal molecules, for organizing the liquid crystal molecules into a regular structure and for buffering the electrodes from chemically interacting with the liquid crystal material. Polarizers 50,52 provide a means for making the electro-optical effect (controlled bi-refringence) of the liquid crystal material more evident and pronounced.

As particularly illustrated in FIG. 4 and as schematically represented in FIG. 5, the structure of liquid crystal material 32 in combination with electrodes 42,44 forms a classical plate capacitor 60, as illustrated in FIG. 4. The liquid crystal (plus the intervening alignment and buffering layers) acts as the dielectric and the electrodes act as the conductive plates. The amount of capacitance is defined by the formula shown in FIG. 5:

$$C = keA/d$$

where:
k is the dielectric coefficient of the liquid crystal material;
e is the dielectric coefficient of air;
A is the coupling area of the conductive plates; and
d is the distance between the plates.

The elements of this structure combine to produce an electrical capacitor which is shown schematically in FIG. 5. This is a first order model. Other well known phenomena can be incorporated to provide the model with more detail and higher degrees of accuracy. For example, the dielectric constant of the liquid crystal material is anisotropic with respect to voltage. That is, it is a function of the applied voltage, as depicted by the graph in FIG. 6. As the voltage across the liquid crystal display is increased from the 10% point of optical effect, $V_{10}$, to the 90% point $V_{90}$ (note FIG. 2A), the dielectric constant of the liquid crystal typically rises from $k_0$ to $k_{0S}$, where $k_0$ is the original or starting dielectric constant and $k_{0S}$ implies the dielectric constant at optical saturation. Increasing the voltage beyond the $V_{90}$ increases the dielectric constant further to $k_{es}$, the electrical saturation value of k. K typically increases by factors of 3 when the applied voltage is increased from $V_{10}$ to $V_{90}$. Such second order effects in the design of the liquid crystal display should be considered since such second order effects can impact the desired performance objectives.

It is important to note that alternative liquid crystal structures do exist and that the implementation of the invention is not constrained to a particular parallel glass plate structure. For example, plates of plastic instead of glass can be used. More esoteric structures, such as microencapsulated liquid crystal material within a polymer that creates liquid crystal miniature bubbles within a plastic sheet, could be used.

Tailoring the plate capacitor variables, k, e, A and d, with respect to the available energy and the size of the pickup electrodes allows a designer to handle particular circumstances. The liquid crystal material itself exhibits a useful threshold characteristic which can be used to set either high/low or pass/fail criteria for the amount of energy present. Different liquid crystal materials have different thresholds. Choosing the liquid crystal material carefully allows one to choose the voltage which will result in either optical activation or deactivation.

The specific application for which the invention was created addresses the area of E-Field detection and, in particular, the finding of faulty open components in series circuits. As the invention was conceived and reduced to practice for the purpose of detecting open circuited bulbs in an ornamental string of series connected lights circuit, the discussion below directed to an operative embodiment and the theory of operation will be addressed to such a circuit.

The best pickup electrode configurations found by experiment incorporate conductive foam. This material is readily available, is low in cost and is widely used during shipping and storing to protect sensitive electronic parts from being accidentally damaged by electro-static discharge. However, other materials for the pickup electrodes have also been used successfully. These include conductive paint, epoxy and metal foil. Any of these materials can provide an advantage where reduced size of the pickup electrodes is of manufacturing or commercial significance. Furthermore, electroplated metal on a plastic base would also provide the necessary electrical characteristics to function as pickup electrodes. An advantage of using a plastic material is that of conforming the plastic to a particular shape for receiving a particular conductor of interest or other circuit component which is to be tested. The ultimate selection of the material and configuration of the pickup electrodes is primarily dictated by manufacturing considerations, cost and configuration of the element to be tested.

Figure 7C:
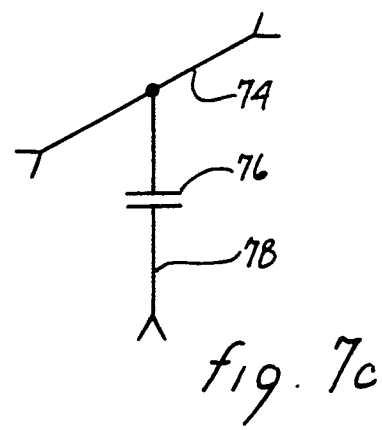
FIG. 7C is a schematic of the components illustrated in FIG. 7B.
Figure 7A:
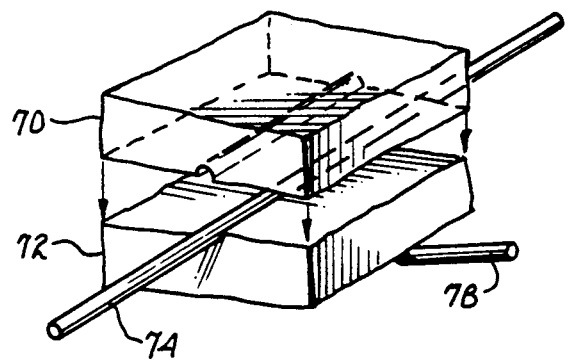
FIG. 7A illustrates an operative embodiment of a capacitive pickup prior to installation.
Figure 7B:
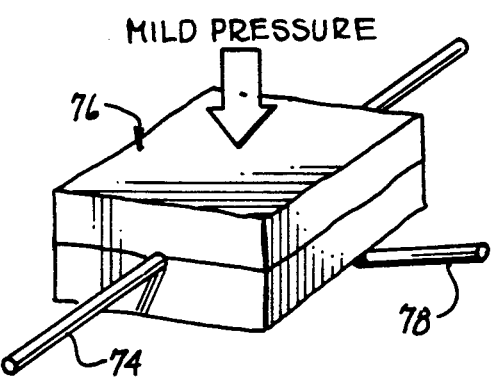
FIG. 7B illustrates an operative embodiment in engagement with a wire under test.

As illustrated in FIGS. 7A, 7B and 7C, a pair of opposed pads of conductive foam 70,72 were very effective when used to envelope a wire 74 carrying a signal under test. When mild pressure is applied to the opposed pads, the pads tend to conform closely to the physical shape of the wire despite irregular twists and turns of the wire. The close physical conformity allowed the pads to couple with the E-Field under test extremely efficiently. The pickup electrodes were modeled as a capacitor with one terminal connected to wire 74. The other terminal of capacitor 76 (combined pads 70,72) was obtained by inserting (or connecting) a wire 78 into one of pads 70,72. Only one pad needs an electrode because once the two pads are pressed together, they behave as one tube of conducting foam surrounding wire 74. In an alternative configuration, the two pads could be replaced by a sheet of conductive foam folded about and surrounding the conductor under test. Such configuration has been shown in a laboratory to exhibit considerably higher capacitance per unit length with respect to an aluminum foil tube and therefore more pickup capability to sense the field carried by the conductor under test. Foam also has the advantage of offering some degree of static protection for the liquid crystal. A metal or conductive paint implementation, however, has the mechanical advantage of smaller size. The resulting circuit is illustrated schematically in FIG. 7C.

Figure 8A:
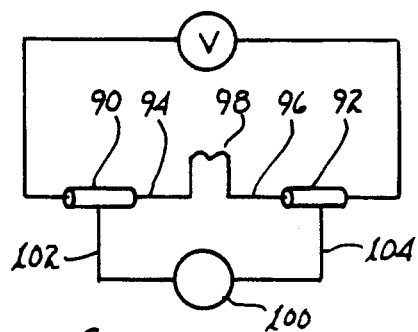
FIGS. 8A, 8B and 8C illustrate evolvement of schematics representative of the physical embodiment of the invention.
Figure 8B:
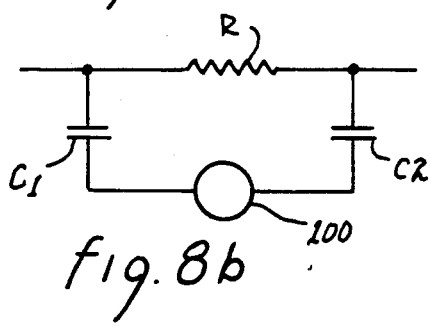
Figure 8C:
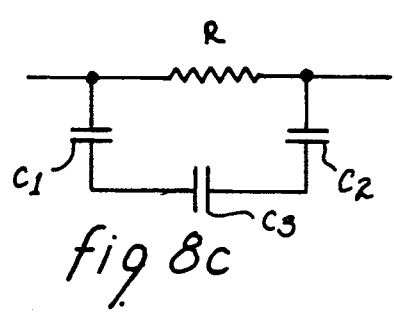

Referring jointly to FIGS. 8A, 8B and 8C, the use and operation of the present invention with respect to an ornamental string of lights circuit will be described.

Figure 9:
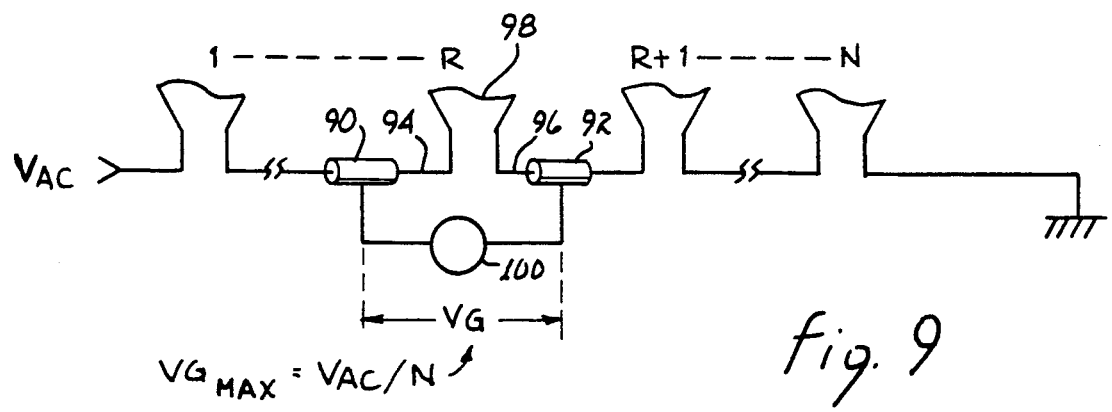
FIGS. 9, 10, 11 and 12 illustrate use of the present invention under different conditions of continuity of an electrical conductor under test.
Figure 10:
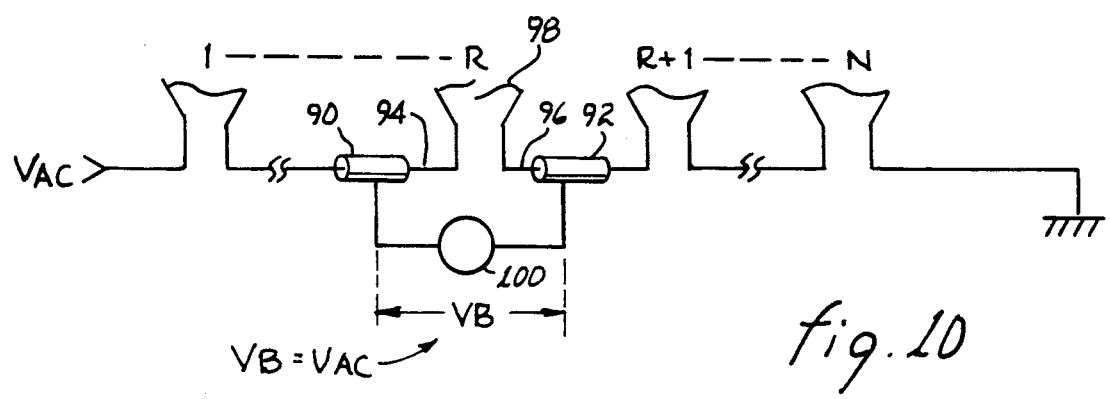
Figure 11:
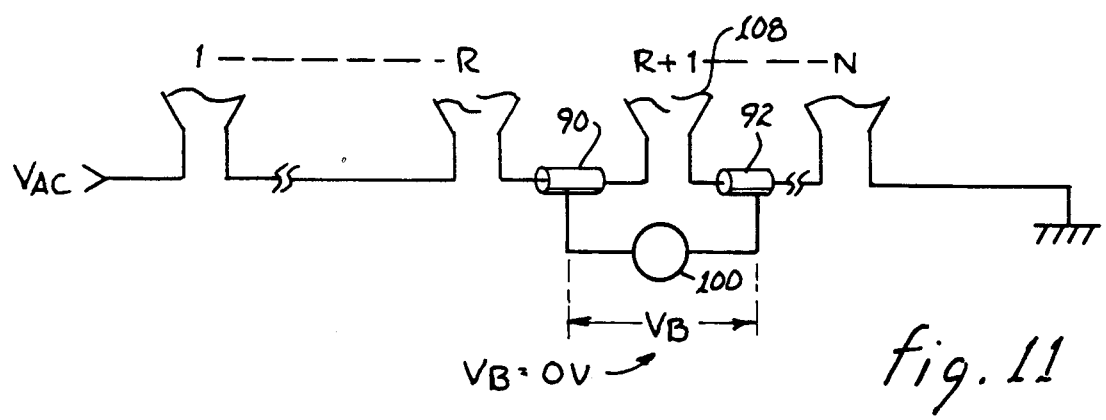

FIG. 8A is a schematic of the invention in use. A pair of electrodes 90,92 are placed about conductors 94,96 extending from either side of a lamp 98 under test. These electrodes pick up a voltage represented by V across lamp 98. This voltage is conveyed to the detector and annunciator 100, such as a liquid crystal display via conductors 102 and 104. The physical components illustrated in FIG. 8A are electrically represented in FIG. 8B wherein resistor R represents the lossy impedance of lamp 98 and capacitors C1 and C2 represent electrodes 90,92, respectively. Considering that the detector and annunciator, if a liquid crystal display, constitute a capacitor, C3 may be inserted in place of detector and annunciator 100. The resulting electrical circuit is depicted in FIG. 8C. Accordingly, the capacitance of electrodes 90,92 and detector and annunciator 100 may be adjusted in accordance with Ohm's Law to provide the proper amount of voltage needed to set the pass/fail criteria of the liquid crystal display for a given set of conditions. For example, if lamp 98, shown in FIG. 9, is operable, the capacitances of the electrodes and the liquid crystal display are set so that the display threshold will not be exceeded. Consequently, a faulty circuit condition will not be detected and a pass indication will be provided by the liquid crystal display. Alternatively, as shown in FIG. 10, if lamp 98 is open circuited, a very large voltage will exist across the lamp. With the capacitance of the electrodes and liquid crystal display set properly, the liquid crystal display will be activated to provide a visible cue or annunciation that a failed lamp has been detected.

Where a string of lights circuit includes more than one open circuited lamp, additional measurements must be made to identify each failed lamp. The procedures for such detection are illustrated in the configurations depicted in FIGS. 11 and 12. For example, failed lamps 98 and 108 are depicted. If electrodes 90,92 are placed across lamp 108, the voltage sensed, $V_B$, will be 0. This is due to the fact that the failed open lamp 98 prevents substantial power or energy or E-Field from being established across lamp 108. Consequently, failure of lamp 108 may not be detected until failed lamp 98 is detected. In the event lamp 98 is tested first, a voltage will exist thereacross and the resulting E-Field will be sensed by electrodes 90,92. However, the magnitude of the voltage and the E-Field may only be one-half of the amplitude present due to the capacitive coupling to the portion of the circuit isolated by open bulb 108. Assuming that the threshold and capacitances of the components have been properly selected or adjusted, the condition represented by open lamp 98 can be detected. Once lamp 98 is replaced, failed open lamp 108 can be detected.

Figure 12:
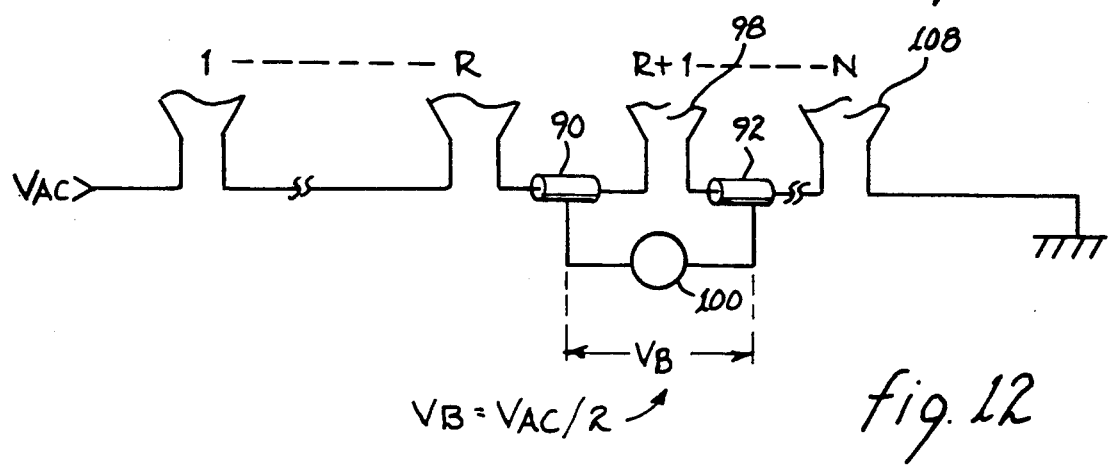

In summary, for K failed open lamps in a given circuit, K or less passes must be made over the circuit to find each of the lamps failed. As each failed lamp is found, it must be replaced, as illustrated in FIG. 12, before subsequent passes over the circuit will prove beneficial. Because, on average, half of the failed open lamps can be expected to occur on the unpowered portion of the circuit, only K/2 passes need be exercised over the string to find K failed open lamps.

Although the invention was created and applied to a relatively limited type of circuit, it will be readily apparent to those skilled in the art that the present invention can be used readily for tracing electrical conductors, such as telephone lamps, power lines, etc., to locate and identify an open circuit condition. Once the location of the open circuit is detected with the present invention, splicing or other repair can be effected and replacement of the conductor can be avoided.

As noted above, the passive detection and annunciating circuitry disclosed could be replaced by active circuitry requiring a power supply. However, for applications in which cost is paramount, the capacitive coupling to energize a liquid crystal display is unsurpassed. Considering further that the parameters attendant detection and annunciation can be readily modified to meet certain criteria, the utility and applicability of the present invention is unbounded.

While the principles of the invention have now been made clear in an illustrative embodiment, there will be immediately obvious to those skilled in the art many modifications of structure, arrangement, proportions, elements, materials and components used in the practice of the invention which are particularly adapted for specific environments and operating requirements without departing from those principles.

I claim:

1. Apparatus for detecting and annunciating the presence of an E-Field above a threshold energy level, said apparatus comprising in combination:
    a) conductive foam E-Field sensor means for capacitively coupling with the E-Field to generate an electrical signal;
    b) passive electro-optic means for detecting an annunciating the presence of an electrical signal above a predetermined threshold; and
    c) means for electrically interconnecting said conductive foam E-Field sensor means directly to said electro-optic means to energize and to actuate said electro-optic means in response to an above threshold electrical signal generated by said conductive foam E-Field sensor means.

2. The apparatus as set forth in claim 1 wherein said electro-optic means is a high input impedance passive device.

3. The apparatus as set forth in claim 1 wherein said electro-optic means is electrically simulative of a plate capacitor.

4. The apparatus as set forth in claim 1 wherein said electro-optic means is a liquid crystal display.

5. The apparatus as set forth in claim 1 wherein said conductive foam E-Field sensor means include a quantity of high impedance foam.

6. The apparatus as set forth in claim 5 wherein said electro-optic means is a high input impedance device.

7. The apparatus as set forth in claim 5 wherein said electro-optic means is electrically simulative of a capacitor.

8. The apparatus as set forth in claim 5 wherein said electro-optic means is a liquid crystal display.

9. The apparatus as set forth in claim 1 wherein the E-Field is developed at the site of a discontinuity in an electrically energized circuit and wherein said conductive foam E-Field sensor means include means for locating said conductive E-Field sensor means proximate the circuit discontinuity.

10. The apparatus as set forth in claim 9 wherein said conductive foam E-Field sensor means include means for enveloping the discontinuity of the energized circuit.

11. The apparatus as set forth in claim 10 wherein said enveloping means includes at least one pad of conductive foam.

12. The apparatus as set forth in claim 11 wherein the foam is conformable to at least partially envelope the discontinuity of the energized circuit.

13. The apparatus as set forth in claim 9 wherein said electro-optical means is a high input impedance device.

14. The apparatus as set forth in claim 9 wherein said electro-optic means is electrically simulative of a capacitor.

15. The apparatus as set forth in claim 9 wherein said electro-optic means is a liquid crystal display.

16. A method for detecting and annunciating the presence in an electrical circuit of an E-Field when said E-Field is above a predetermined threshold energy level, said method comprising the steps of:
    a) capacitively coupling with the E-Field using a conductive foam E-Field sensor means and generating an electrical signal reflective of the magnitude of the E-Field;
    b) conveying the generated electrical signal directly to an electro-optic means;
    c) detecting at the electro-optic means the generated electrical signal if the generated electrical signal is above a predetermined magnitude;
    d) annunciating the detected electrical signal to provide an indication of the presence of the E-Field and that the energy level of the E-Field is greater than a predetermined threshold value; and
    e) energizing the electro-optic means to carry out said steps of detecting and annunciating solely from the generated electrical signal.

17. The method as set forth in claim 16 including a liquid crystal display for carrying out both of said step of detecting and said step of annunciating.

18. The method as set forth in claim 16 wherein said step of capacitively coupling includes the step of locating a quantity of conductive foam proximate the electrical circuit.

19. The method as set forth in claim 18 wherein said step of locating includes the step of enveloping the electrical circuit with the conductive foam.

20. The method as set forth in claim 19 including a liquid crystal display for carrying out said step of detecting and said step of annunciating.

21. Passive apparatus for employing energy of an E-Field present at an open circuit in an electrically charged circuit for detecting and annunciating the location of the open circuit, said apparatus comprising in combination:
    a) conductive foam E-Field sensor means for capacitively coupling with the E-Field present at the open circuit to generate an electrical signal;
    b) electro-optic means for detecting and annunciating the presence of the generated electrical signal, said electro-optic means being energized solely by the generated electrical signal; and
    c) means for electrically interconnecting said conductive foam E-Field sensor means with said electro-optic means to convey the generated signal from said conductive foam E-Field sensor means to said electro-optic means.

22. The apparatus as set forth in claim 21 wherein said electro-optic means comprises a liquid crystal display.

23. The apparatus as set forth in claim 21 wherein said electro-optic means is one component.

24. Apparatus for identifying a failed electrical light bulb in a string of ornamental electrically energized light bulbs, said apparatus employing the energy of an E-Field present at an open circuit attendant the failed light bulb to detect and annunciate the location of the failed light bulb along the string of light bulbs, said apparatus comprising in combination:
 a) conductive foam E-Field sensor means for capacitively coupling with the E-Field present at the open circuit to generate an electrical signal;
 b) electro-optic means for detecting and annunciating the presence of the electrical signal generated solely by said coupling means; and
 c) means for electrically interconnecting said conductive foam E-Field sensor means with said electro-optic means to convey the generated electrical signal from said conductive foam E-Field sensor means directly to said electro-optic means.

* * * * *